(12) United States Patent
El-Kik

(10) Patent No.: US 7,755,397 B2
(45) Date of Patent: Jul. 13, 2010

(54) METHODS AND APPARATUS FOR DIGITAL PHASE DETECTION WITH IMPROVED FREQUENCY LOCKING

(75) Inventor: Tony S. El-Kik, Allentown, PA (US)

(73) Assignee: Agere Systems Inc., Allentown, PA (US)

(*) Notice: Subject to any disclaimer, the term of this patent is extended or adjusted under 35 U.S.C. 154(b) by 0 days.

(21) Appl. No.: 12/178,286

(22) Filed: Jul. 23, 2008

(65) Prior Publication Data

US 2010/0019799 A1 Jan. 28, 2010

(51) Int. Cl.
*G01R 25/00* (2006.01)
*H03D 13/00* (2006.01)

(52) U.S. Cl. ............... 327/12; 327/3; 327/5; 327/7; 327/9; 327/10; 331/25

(58) Field of Classification Search ............ 327/2, 327/3, 5, 7–10, 12; 331/25
See application file for complete search history.

(56) References Cited

U.S. PATENT DOCUMENTS 5,539,345 A * 7/1996 Hawkins .................. 327/150
5,789,947 A * 8/1998 Sato ........................... 327/3
6,218,868 B1 * 4/2001 Katoh ......................... 327/12
7,142,025 B2 * 11/2006 Milani et al. ............... 327/156

FOREIGN PATENT DOCUMENTS

JP 04234226 A * 8/1992

* cited by examiner

*Primary Examiner*—Lincoln Donovan
*Assistant Examiner*—Patrick O'Neill
(74) *Attorney, Agent, or Firm*—Ryan, Mason & Lewis, LLP

(57) ABSTRACT

Methods and apparatus are provided for digital phase detection with improved frequency locking. A phase detector is disclosed for evaluating a phase difference between a clock signal and a reference signal. The disclosed phase detector samples the clock signal and the reference signal on positive edges of one or more of the clock signal and the reference signal, samples the clock signal and the reference signal on negative edges of one or more of the clock signal and the reference signal, and generates one or more error signals indicating a phase difference between the clock signal and the reference signal. A clock signal that is phase aligned with a reference signal can be generated by generating an error signal indicating a phase difference between the clock signal and the reference signal and applying the error signal to an oscillator to produce the clock signal.

22 Claims, 5 Drawing Sheets

METHODS AND APPARATUS FOR DIGITAL PHASE DETECTION WITH IMPROVED FREQUENCY LOCKING

FIELD OF THE INVENTION

The present invention relates generally to clock generation techniques for digital communications, and more particularly, to phase detection techniques for generating clock signals with improved frequency locking characteristics.

BACKGROUND OF THE INVENTION

Digital Phase-locked loop (DPLL) circuits are frequently utilized to lock an oscillator in phase with an applied reference signal. DPLL circuits are often utilized within receivers in digital communication systems, for example, to generate a local clock signal that is phase aligned with an incoming reference signal. The phase aligned local clock signal facilitates the receipt and processing of data sent by a transmitter in the communication system.

A conventional DPLL circuit includes a phase detector, a filter and a digital controlled oscillator (DCO). In the conventional DPLL circuit, the phase detector compares the incoming reference signal and the output of the DCO. The phase detector generates an error signal that is representative of the phase difference of the reference signal and the DCO output. The error signal is filtered and applied to the control input of the DCO to produce an output signal that tracks the phase of the reference signal.

FIG. 1 is a block diagram of an exemplary conventional DPLL circuit 100. As shown in FIG. 1, the DPLL circuit 100 comprises a phase detector 110, a digital filter 120, a digital controlled oscillator 130 and a divider 140. Generally, the phase detector 110 compares the frequency of the two input signals (an applied reference clock, RCK, and a feedback clock, FCK) and generates one or more error signals, such as UP and DOWN (DN), that provide a measure of the phase difference between the two input signals. As shown in FIG. 1, the exemplary error signals, UP and DOWN, are applied to the digital filter 120 which generates a binary error value, such as an 8 bit error value in the exemplary embodiment. The binary error value is applied to the digital controlled oscillator 130 and causes the digital controlled oscillator 130 to deviate in the direction of the reference signal, RCK. Eventually, the digital controlled oscillator 130 will "lock" and maintain a fixed relationship with the reference signal, RCK. It is noted that an additional divider (not shown) may be positioned between the input of the reference signal, RCK, and the phase detector 110.

There are a number of known implementations for the phase detector 110 of FIG. 1. FIG. 2 is a circuit diagram of an exemplary conventional phase detector 110 of FIG. 1. As shown in FIG. 2, the exemplary phase detector 110 is comprised of two flip-flops, FF1 and FF2, and a NAND gate 220. The UP and DN pulses, which occur on the basis of phase differences between the two clocks FCK and RCK, are updated on the positive edges of the two clocks, FCK and RCK, in a known manner. Each flip-flop, FF1 and FF2, samples a corresponding applied input clock signal and the NAND gate 220 performs a comparison operation that indicates which applied clock is leading. Generally, the UP signal indicates that the output of the digital controlled oscillator 130 is too slow, relative to the applied reference clock, while the DOWN signal indicates that the output of the digital controlled oscillator 130 is too fast, relative to the applied reference clock. The output of the NAND gate 220 is applied as a reset to each flip-flop, FF1 and FF2. The output of the NAND gate 220 has a binary value of logic one, whenever one or both flip-flops are low. The output of the NAND gate 220 has a binary value of logic zero whenever both flip-flops are high. Thus, when the two applied clocks are aligned, the flip-flop outputs will both have values of logic zeros.

A number of techniques have been proposed or suggested for improving the frequency locking characteristics of such PLL circuits. For example, one technique has proposed reducing the duration of the reset pulse to shorten the unused time between each update period. This proposal, however, requires the use of additional capacitors, delay elements and logic differential amplifiers that are not shown in FIG. 2. It has been found, however, that under certain conditions, the flip-flops, FF1 and FF2, would not reset properly and the PLL circuit 100 will eventually lock onto the wrong frequency when the reset pulse is not long enough.

A need therefore exists for methods and apparatus for digital phase detection with improved frequency locking characteristics.

SUMMARY OF THE INVENTION

Generally, methods and apparatus are provided for digital phase detection with improved frequency locking. According to an aspect of the invention, a phase detector is disclosed for evaluating a phase difference between a clock signal and a reference signal. The disclosed phase detector comprises a first logic circuit for (i) sampling the clock signal and the reference signal on positive edges of one or more of the clock signal and the reference signal, and (ii) generating one or more error signals indicating a phase difference between the clock signal and the reference signal; and a second logic circuit for (i) sampling the clock signal and the reference signal on negative edges of one or more of the clock signal and the reference signal, and (ii) generating one or more error signals indicating a phase difference between the clock signal and the reference signal.

In one implementation, the error signals generated by the first logic circuit and the error signals generated by the second logic circuit each comprise UP and DOWN error signals, and the phase detector further comprises one or more OR gates to generate an overall UP error signal and an overall DOWN error signal. The first and second logic circuits can each comprise a flip-flop for sampling the clock signal and a flip-flop for sampling the reference signal. In addition, the first and second logic circuits can each comprise a NAND gate for comparing samples of the clock signal and the reference signal. The output of the NAND gate and a main reset value can be processed to ensure that two of the one or more error signals do not simultaneously have a predefined binary value. The first and second logic circuits can each comprise a delay buffer to lengthen one or more reset pulses.

According to a further aspect of the invention, a method is disclosed for generating a clock signal that is phase aligned with a reference signal. The disclosed method comprises the steps of generating an error signal indicating a phase difference between the clock signal and the reference signal, wherein the error signal is generated on positive and negative edges of one or more of the clock signal and the reference signal; and applying the error signal to an oscillator to produce the clock signal.

A more complete understanding of the present invention, as well as further features and advantages of the present invention, will be obtained by reference to the following detailed description and drawings.

DETAILED DESCRIPTION

The present invention provides methods and apparatus for digital phase detection with improved frequency locking. According to further aspects of the invention, the disclosed phase detectors contain a reset mechanism that functions properly and ensure that the DPLL circuit will lock at the proper frequency.

Figure 2:
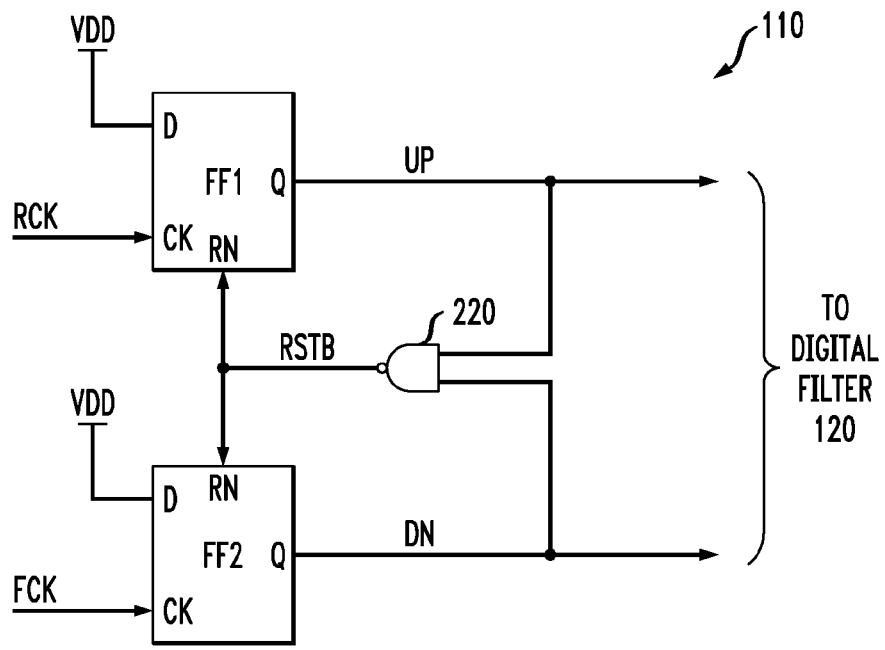
FIG. 2 is a circuit diagram of an exemplary conventional phase detector of FIG. 1.
Figure 3:
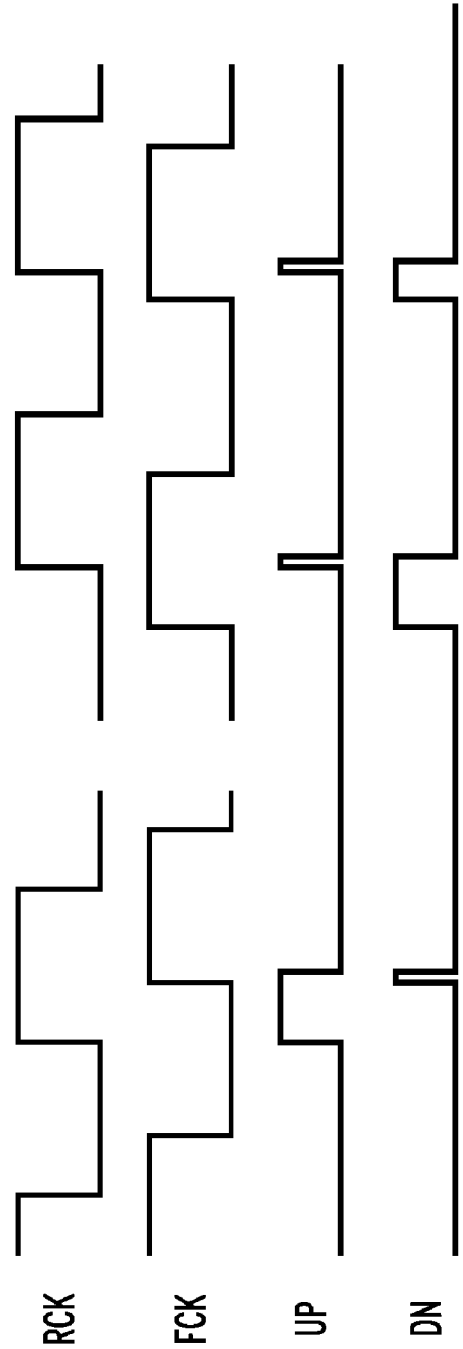
FIG. 3 is a timing diagram illustrating two clocks that are applied to the phase detector of FIG. 2, as well as the corresponding UP and DOWN error signals.

FIG. 3 is a timing diagram illustrating the two clocks that are applied to the phase detector 110 of FIG. 2, as well as the corresponding UP and DOWN error signals generated by the phase detector 110. As shown in FIG. 3, this scheme increases the locking period, making the scheme unsuitable for fast digital phase-locked control loops. As previously indicated, the UP and DN pulses, which occur on the basis of phase differences between the two clocks FCK and RCK, are updated on the positive edges of the two clocks, FCK and RCK, as shown in FIG. 3.

Phase Detector with Improved Frequency Locking

Figure 4:
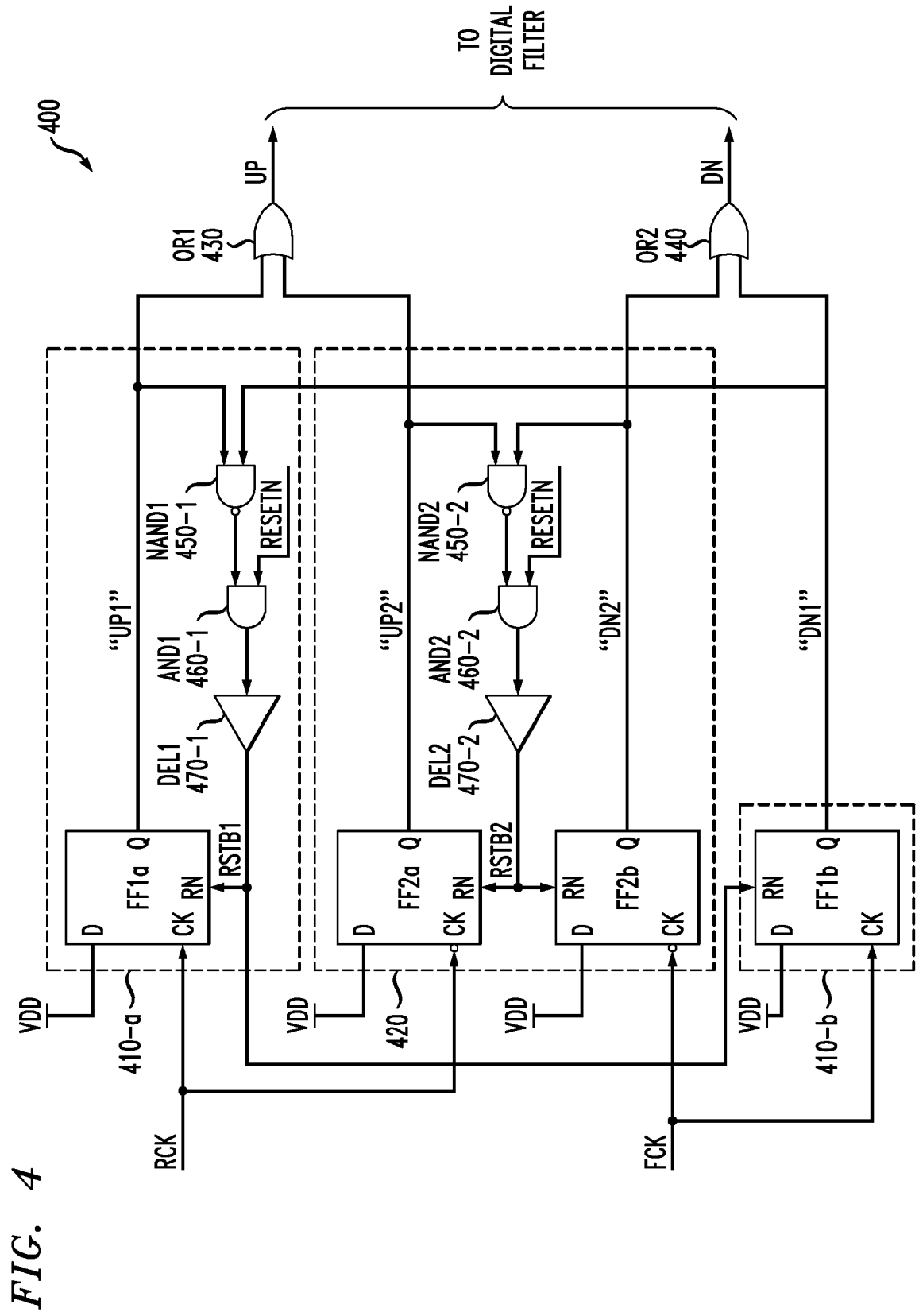
FIG. 4 is a circuit diagram of a phase detector that incorporates features of the present invention.

FIG. 4 is a circuit diagram of a phase detector 400 that incorporates features of the present invention. As shown in FIG. 4, the disclosed phase detector 400 is comprised of two substantially identical circuits 410, 420 and two OR gates 430, 440. Each circuit 410, 420 is comprised of two Flip-Flops (FF1 and FF2), a NAND gate 450, an AND gate 460 and a delay buffer 470.

As shown in FIG. 4, the first circuit 410-a, 410-b (collectively, 410) is comprised of Flip-Flops "FF1a", "FF1b", "NAND1" 450-1, "AND1" 460-1 and "DEL1" 470-1. According to one aspect of the present invention, the first circuit 410 is updated on the positive edges of RCK and FCK to generate the UP1 and DN1 pulses. The second circuit 420, comprised of Flip-Flops "FF2a", "FF2b", "NAND2" 450-2, "AND2" 460-2 and "DEL2" 470-2. The second circuit 420 is updated on the negative edges of RCK and FCK to generate the UP2 and DN2 pulses. In this manner, the error signals, UP and DOWN, are generated on the positive and negative edges of the applied clocks.

Figure 1:
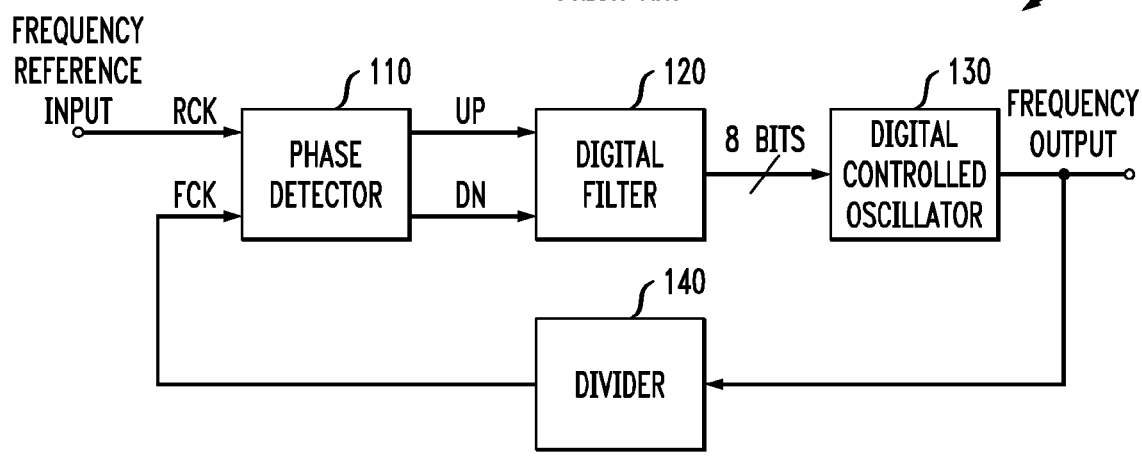
FIG. 1 is a block diagram of an exemplary conventional DPLL circuit.

As shown in FIG. 4, the UP1 and UP2 pulses are applied to the NOR gate 430 to generate the final UP pulse to the Digital Filter 120 (FIG. 1). In addition, the DN1 and DN2 pulses are applied to the NOR gate 440 to generate the final DN pulse to the Digital Filter 120 (FIG. 1). Effectively, this disclosed scheme would double the updates to the Digital Filter 120 using both edges of the clocks.

According to a further aspect of the invention, the output of the NAND gates 450-1 and 450-2 are applied to a corresponding AND gate 460-1, 460-2 with a main reset. The AND gates 460-1, 460-2 ensure binary values of 0 upon start up of the digital controlled oscillator 130. Thus, the feedback divider 140 of the FCK clock can wake up in a normal operation state. If the UP signal is "0" and the DN signal is "1", then the counter will slow down. If the UP signal is "1" and the DN signal is "0", then the counter will run faster. If the UP and DN signals are both "0", then the counter will keep its state, referred to as the lock state.

According to yet another aspect of the invention, the UP1, UP2, DN1, and DN2 are lengthened by the delay buffers 470-1 and 470-2. In this manner, the Reset Pulses "RSTB1" and "RSTB2" are lengthened and give the flip-flops FT1a, FF1b, FF2a, FF2b enough time to reset. As previously indicated, if the flip-flops FF1a, FF1b, FF2a, FF2b are not reset properly, it will throw off the Digital filter 120 and eventually the output of the Digital Filter 120 (which is fed to the digital controlled oscillator 130) will cause the digital controlled oscillator 130 to lock to the wrong frequency.

Figure 5:
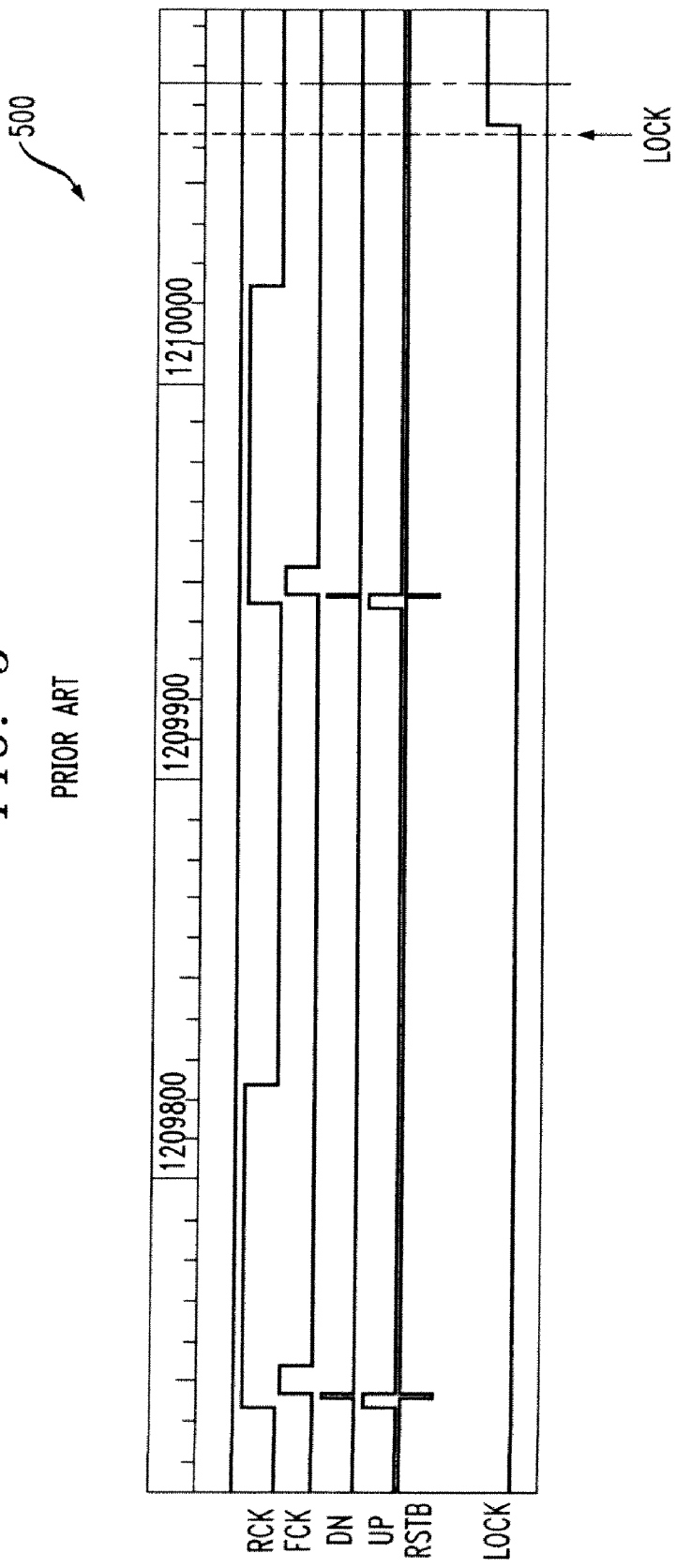
FIGS. 5 and 6 are timing diagrams illustrating the various signals for the phase detector of FIG. 2 and the phase detector of FIG. 4, respectively.
Figure 6:
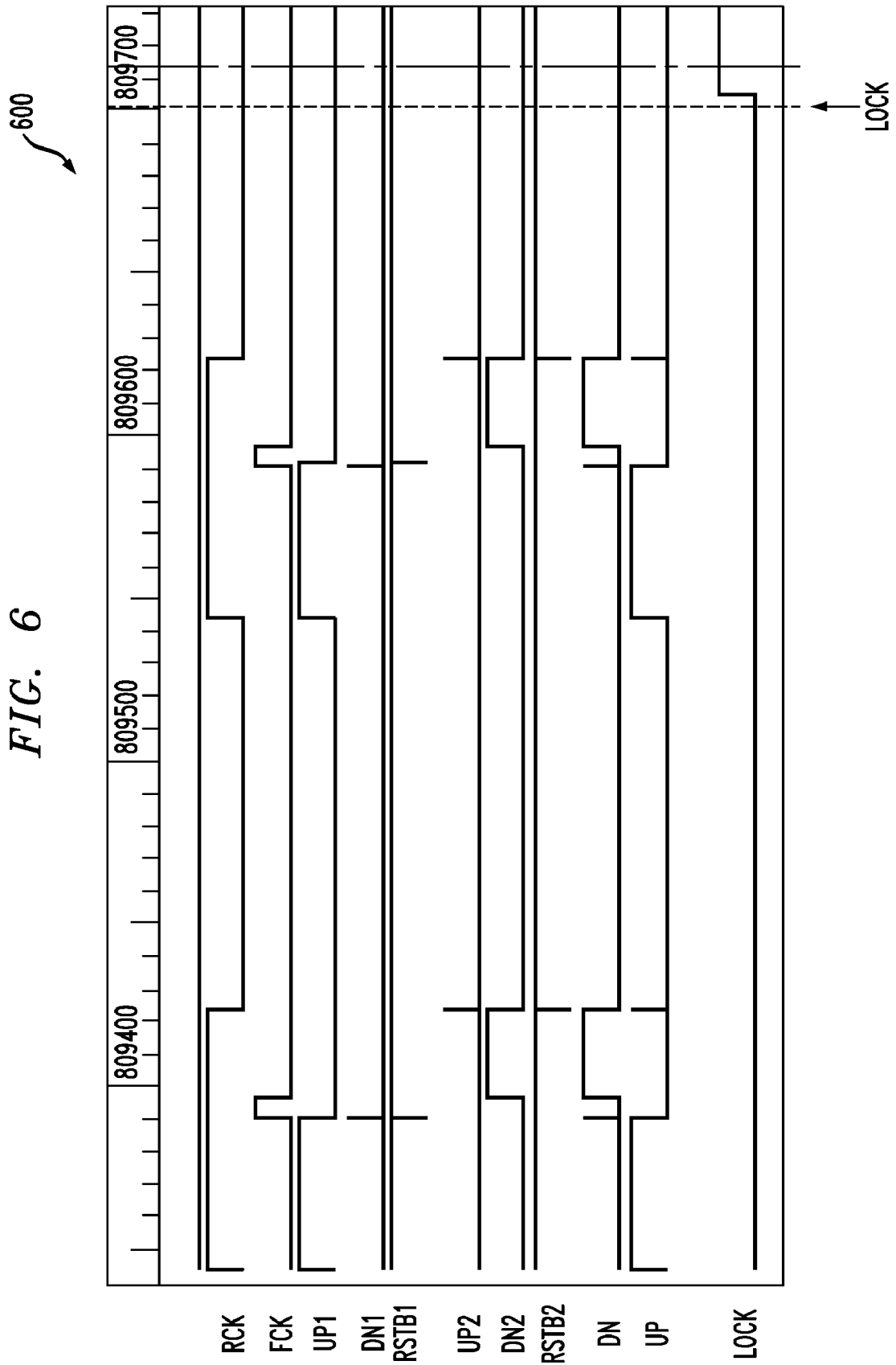

FIGS. 5 and 6 are timing diagrams illustrating the various signals for the phase detector 110 of FIG. 2 and the phase detector 400 of FIG. 4, respectively.

FIGS. 5 and 6 illustrate the two clocks, RCK and FCK, that are applied to the respective phase detector 110, 400, as well as the corresponding UP and DOWN error signals generated by the respective phase detector 110, 400. In addition. FIGS. 5 and 6 illustrate the reset pulses (RSTB) generated by the respective phase detector 110, 400, and locking flag, LOCK, indicating when the digital controlled oscillator 130 is locked.

As shown in FIG. 5, the conventional phase detector 110 updates the UP and DN pulses on only the positive edges of the two clocks, FCK and RCK. As shown in FIG. 6, the phase detector 400 of the present invention updates the UP and DN pulses on both the positive and negative edges of the two clocks, FCK and RCK. It has been found that it took the phase detector 110 approximately 1.2 ms to lock while it took the disclosed phase detector 400 approximately 800 μs to lock (approximately a 40% improvement in lock acquisition).

The present invention recognizes that by using both edges of the reference clock "RCK" and the feedback clock "FCK", the locking mechanism can be improved. In addition, the disclosed phase detector 400 ensures proper resetting of the flip-flops FF1a, FF1b, FF2a, FF2b and provides the correct output frequency.

CONCLUSION

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits.

The invention can also be implemented in one or more of an integrated circuit, a digital signal processor, a microprocessor, and a micro-controller.

A plurality of identical die is typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

I claim:

1. A phase detector for evaluating a phase difference between a clock signal and a reference signal, comprising:
   a first logic circuit for (i) sampling said clock signal and said reference signal on positive edges of one or more of said clock signal and said reference signal, and (ii) generating one or more error signals indicating a phase difference between said clock signal and said reference signal; and
   a second logic circuit for (i) sampling said clock signal and said reference signal on negative edges of one or more of said clock signal and said reference signal, and (ii) generating one or more error signals indicating a phase difference between said clock signal and said reference signal, wherein one or more delay buffers lengthen one or more of said one or more error signals generated by said first logic circuit and said one or more error signals generated by said second logic circuit.

2. The phase detector of claim 1, wherein said one or more error signals are applied to an oscillator to produce said clock signal.

3. The phase detector of claim 1, wherein said one or more error signals generated by said first logic circuit and said one or more error signals generated by said second logic circuit each comprise UP and DOWN error signals, and wherein said phase detector further comprises one or more OR gates to generate an overall UP error signal and an overall DOWN error signal.

4. The phase detector of claim 1, wherein said first logic circuit comprises a flip-flop for sampling said clock signal and a flip-flop for sampling said reference signal.

5. The phase detector of claim 1, wherein said first logic circuit comprises a NAND gate for comparing samples of said clock signal and said reference signal.

6. The phase detector of claim 5, wherein said first logic circuit comprises an AND gate for processing an output of said NAND gate and a main reset value to ensure that two of said one or more error signals do not simultaneously have a predefined binary value for an extended period.

7. The phase detector of claim 1, wherein said first logic circuit comprises one or more of said delay buffers to lengthen one or more of said one or more error signals generated by said first logic circuit.

8. The phase detector of claim 1, wherein said second logic circuit comprises a flip-flop for sampling said clock signal and a flip-flop for sampling said reference signal.

9. The phase detector of claim 1, wherein said second logic circuit comprises a NAND gate for comparing samples of said clock signal and said reference signal.

10. The phase detector of claim 9, wherein said second logic circuit comprises an AND gate for processing an output of said NAND gate and a main reset value to ensure that two of said one or more error signals do not simultaneously have a predefined binary value for an extended period.

11. The phase detector of claim 1, wherein said second logic circuit comprises one or more of said delay buffers to lengthen one or more of said one or more error signals generated by said second logic circuit.

12. A method for generating a clock signal that is phase aligned with a reference signal, comprising:
   sampling said clock signal and said reference signal on positive edges of one or more of said clock signal and said reference signal using a first logic circuit;
   sampling said clock signal and said reference signal on negative edges of one or more of said clock signal and said reference signal using a second logic circuit;
   generating one or more error signals indicating a phase difference between said clock signal and said reference signal using said first logic circuit and said second logic circuit, wherein one or more delay buffers lengthen one or more of said one or more error signals generated by said first logic circuit and said one or more error signals generated by said second logic circuit; and
   applying said one or more error signals to an oscillator to produce said clock signal.

13. The method of claim 12, wherein said one or more error signals comprises UP and DOWN error signals for each of said positive and negative edges, and wherein said method further comprises the steps of generating an overall UP error signal and an overall DOWN error signal.

14. The method of claim 12, further comprising the step of ensuring that two of said one or more error signals do not simultaneously have a predefined binary value for an extended period.

15. The method of claim 12, further comprising the step of lengthening one or more of said one or more error signals for one or more flip-flops.

16. A method for evaluating a phase difference between a clock signal and a reference signal, comprising:
   sampling said clock signal and said reference signal on positive edges of one or more of said clock signal and said reference signal using a first logic circuit;
   generating one or more error signals indicating a phase difference between said clock signal and said reference signal using said first logic circuit;
   sampling said clock signal and said reference signal on negative edges of one or more of said clock signal and said reference signal using a second logic circuit; and
   generating one or more error signals indicating a phase difference between said clock signal and said reference signal using said second logic circuit, wherein one or more delay buffers lengthen one or more of said one or more error signals generated by said first logic circuit and said one or more error signals generated by said second logic circuit.

17. The method of claim 16, further comprising the step of applying said one or more error signals to an oscillator to produce said clock signal.

18. The method of claim 16, wherein said one or more error signals comprise UP and DOWN error signals, and wherein said method further comprises the step of generating an overall UP error signal and an overall DOWN error signal.

19. The method of claim 16, further comprising the steps of sampling said clock signal using a first flip-flop and sampling said reference signal using a second flip-flop.

20. The method of claim 16, further comprising the step of comparing samples of said clock signal and said reference signal.

21. The method of claim 20, further comprising the step of ensuring that two of said one or more error signals do not simultaneously have a predefined binary value for an extended period.

22. The method of claim 16, further comprising the step of lengthening one or more of said one or more error signals.

* * * * *